United States Patent
Nam et al.

(10) Patent No.: US 11,723,243 B2
(45) Date of Patent: Aug. 8, 2023

(54) ORGANIC LIGHT EMITTING DISPLAY DEVICE INCLUDING A CONNECTING STRUCTURE WITH DUMMY PAD ON FLEXIBLE SUBSTRATE

(71) Applicant: SAMSUNG DISPLAY CO., LTD., Yongin-si (KR)

(72) Inventors: Young Eun Nam, Suncheon-si (KR); Cheol Hwan Eom, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 305 days.

(21) Appl. No.: 17/079,613

(22) Filed: Oct. 26, 2020

(65) Prior Publication Data
US 2021/0159304 A1 May 27, 2021

(30) Foreign Application Priority Data

Nov. 26, 2019 (KR) .................. 10-2019-0153761

(51) Int. Cl.
*H10K 59/131* (2023.01)
*H10K 59/88* (2023.01)
*G09G 3/3208* (2016.01)

(52) U.S. Cl.
CPC ........... *H10K 59/131* (2023.02); *H10K 59/88* (2023.02); *G09G 3/3208* (2013.01)

(58) Field of Classification Search
CPC ............ H01L 27/3276; H01L 27/3223; G09G 3/3208; H10K 59/131; H10K 59/88
See application file for complete search history.

(56) References Cited

U.S. PATENT DOCUMENTS

| | | | | |
|---|---|---|---|---|
| 7,795,616 | B2* | 9/2010 | Yamazaki | H01L 27/1292 257/66 |
| 9,831,299 | B2* | 11/2017 | Takahashi | H01L 27/3279 |
| 2013/0148312 | A1* | 6/2013 | Han | H05K 1/028 361/736 |
| 2015/0171151 | A1* | 6/2015 | Chae | H01L 51/5253 438/151 |
| 2016/0212838 | A1* | 7/2016 | Lee | H05K 3/284 |
| 2018/0063962 | A1* | 3/2018 | Lee | G02F 1/13458 |
| 2020/0058725 | A1* | 2/2020 | Ka | H01L 29/42356 |
| 2021/0011325 | A1* | 1/2021 | Yeh | G02F 1/13454 |

FOREIGN PATENT DOCUMENTS

KR    10-1171178    8/2012

* cited by examiner

*Primary Examiner* — Lex H Malsawma
(74) *Attorney, Agent, or Firm* — F. Chau & Associates, LLC

(57) ABSTRACT

An organic light emitting display device may include a substrate having a display area and a non-display area at least partially surrounds the display area, a pixel structure disposed in the display area on the substrate, a via insulating layer disposed in the non-display area on the substrate and having a contact hole, a lower pad disposed on the via insulating layer and a connecting structure. Here, the connecting structure may include a flexible substrate disposed on the lower pad, an upper pad disposed between the flexible substrate and the lower pad, and an upper dummy pad spaced apart from the upper pad in a first direction on a bottom surface of the flexible substrate.

21 Claims, 6 Drawing Sheets

ORGANIC LIGHT EMITTING DISPLAY DEVICE INCLUDING A CONNECTING STRUCTURE WITH DUMMY PAD ON FLEXIBLE SUBSTRATE

CROSS-REFERENCE TO RELATED APPLICATION

This U.S. non-provisional patent application claims priority under 35 U.S.C. § 119 to Korean Patent Application No. 10-2019-0153761, filed on Nov. 26, 2019, in the Korean Intellectual Property Office (KIPO), the disclosure of which is incorporated by reference herein in its entirety.

TECHNICAL FIELD

The present disclosure relates to an organic light emitting display device, more particularly, to an organic light emitting display device including a connecting structure.

DISCUSSION OF THE RELATED ART

Display devices include a liquid crystal display device, an organic light emitting display device, and the like. For example, the organic light emitting display device includes a display substrate that provides a pixel area and a non-pixel area. In addition, the organic light emitting display device includes a sealing substrate disposed to face the display substrate for sealing the display substrate. The sealing substrate is bonded to the display substrate by a sealing material such as epoxy.

Pixels emitting light are formed in the pixel area of the display substrate, and a pad is formed in the non-pixel area of the display substrate. After the pad is formed on the display substrate, a connecting structure may be connected to the pad.

A flexible printed circuit board (FPC or flexible PCB) on panel (also known as "FOP") connection method is used to directly connect the FPC to the pad. In this case, an integrated circuit is formed in the non-pixel area of the display substrate. The FOP connection method may include the process of connecting the connecting structure to the pad. In some cases, after connecting the connecting structure on the pad, a portion of the connecting structure positioned adjacent to the integrated circuit may be removed. A residue may occur in the process of removing the portion of the connecting structure, and the residue may be in contact with an anisotropic conductive film which connects the pad and the connecting structure. In this case, the pad or a pad included in the connecting structure may be shorted by the residue.

SUMMARY

According to an exemplary embodiment, an organic light emitting display device may include a substrate having a display area and a non-display area at least partially surrounds the display area, a pixel structure disposed in the display area on the substrate, a via insulating layer disposed in the non-display area on the substrate and having a contact hole, a lower pad disposed on the via insulating layer and a connecting structure. Here, the connecting structure may include a flexible substrate disposed on the lower pad, an upper pad disposed between the flexible substrate and the lower pad, and an upper dummy pad spaced apart from the upper pad in a first direction on a bottom surface of the flexible substrate.

In an embodiment of the inventive concept, the upper pad may at least partially overlap the lower pad.

In an embodiment of the inventive concept, the organic light emitting display device may further include a signal wiring spaced apart from the lower pad in the first direction on the via insulating layer.

In an embodiment of the inventive concept, the organic light emitting display device may further include a connecting electrode disposed between the via insulating layer and the substrate.

In an embodiment of the inventive concept, the contact hole of the via insulating layer may include a first contact hole at least partially overlapping the lower pad and a second contact hole at least partially overlapping the signal wiring.

In an embodiment of the inventive concept, the lower pad is connected to a first portion of the connection electrode through the first contact hole, and the signal wiring may be connected to a second portion of the connection electrode different from the first portion of the connection electrode through the second contact hole.

In an embodiment of the inventive concept, the organic light emitting display device may further include a lower dummy pad disposed on the via insulating layer between the signal wiring and the lower pad.

In an embodiment of the inventive concept, the lower dummy pad, the signal wiring and the lower pad may be located on a same layer.

In an embodiment of the inventive concept, the upper dummy pad may at least partially overlap the lower dummy pad.

In an embodiment of the inventive concept, the organic light emitting display device may further include an anisotropic conductive film disposed between the upper pad and the lower pad.

In an embodiment of the inventive concept, the anisotropic conductive film may be spaced apart from the signal wiring.

In an embodiment of the inventive concept, the anisotropic conductive film may be in contact with the upper dummy pad or the lower dummy pad.

In an embodiment of the inventive concept, the anisotropic conductive film may fill a space where the upper pad is spaced apart from the upper dummy pad and a space where the lower pad is spaced apart from the lower dummy pad.

In an embodiment of the inventive concept, the organic light emitting display device may further include an integrated circuit disposed in the non-display area on the substrate.

In an embodiment of the inventive concept, the via insulating layer may not overlap the integrated circuit.

In an embodiment of the inventive concept, a first end portion of the signal wiring may at least partially overlap the via insulating layer, and a second end portion, which is opposite to the first end portion, of the signal wiring is connected to the integrated circuit.

In an embodiment of the inventive concept, the pixel structure may include a lower electrode disposed in the display area on the substrate, an intermediate layer disposed on the lower electrode and an upper electrode disposed on the intermediate layer.

In an embodiment of the inventive concept, the organic light emitting display device may further include a semiconductor element disposed between the pixel structure and the substrate, and the semiconductor element may include an active layer disposed on the substrate, a gate electrode disposed on the active layer and a source electrode and a drain electrode disposed on the gate electrode.

In an embodiment of the inventive concept, the organic light emitting display device may further include a wiring pattern disposed on the source electrode and the drain electrode. Here, the wiring pattern and the lower pad may be located on a same layer.

In an embodiment of the inventive concept, the organic light emitting display device may further include another via insulating layer disposed in the display area on the substrate and the another via insulating layer covers the wiring pattern.

According to some exemplary embodiments of the present invention, the organic light emitting display device may include pads having the upper dummy pattern and the lower dummy pattern. Accordingly, even if a residue adheres to an end portion of the anisotropic conductive film, the pads might not be shorted, and driving efficiency of the organic light emitting display device may be increased.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
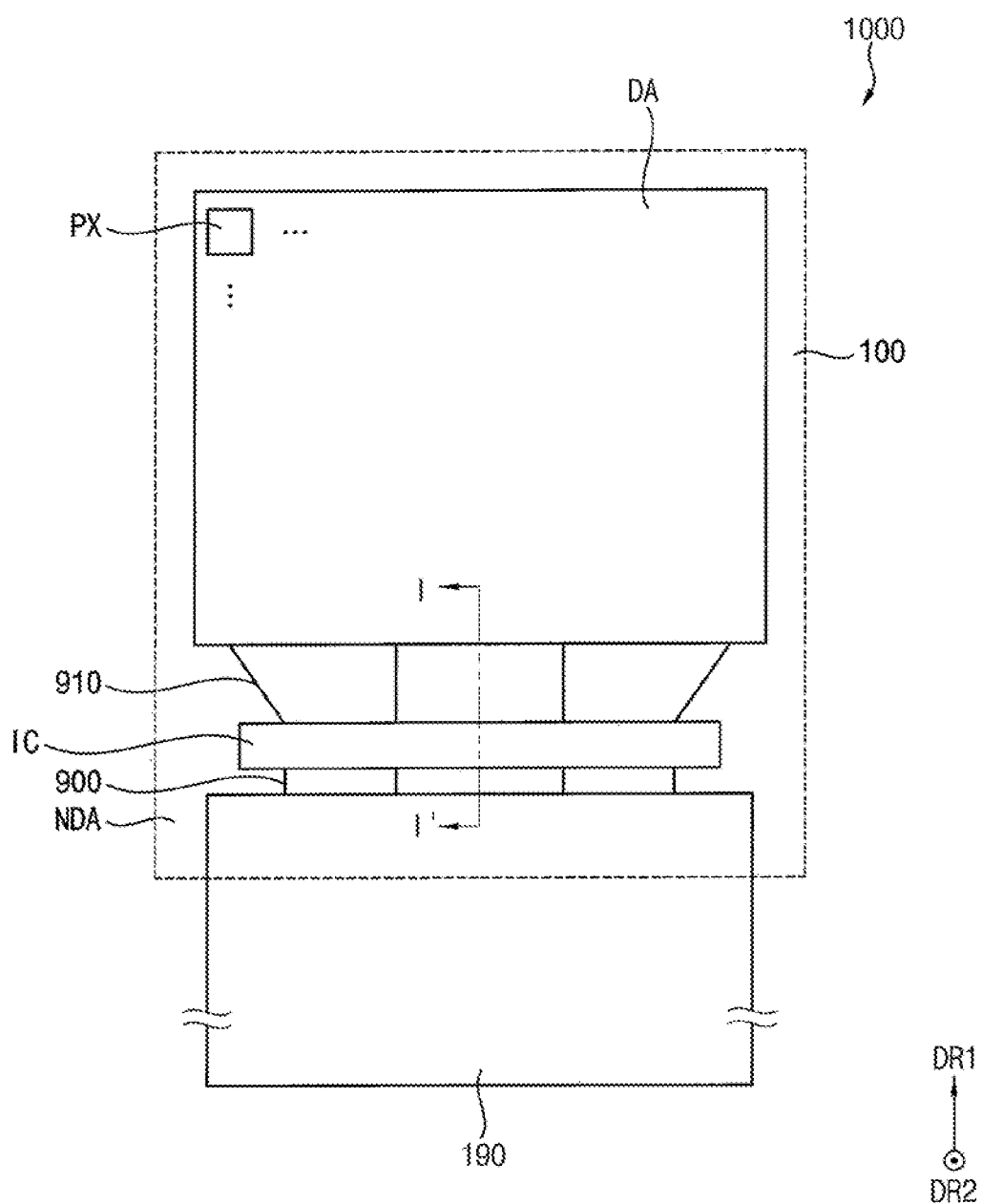
FIG. 1 is a plan view illustrating an organic light emitting display device according to an exemplary embodiment of the present inventive concept.

Herein, it will be understood that when an element of layer is referred to as being "on", "connected to", or "coupled to" another component, it can be directly on, connected or coupled to the other element or layer, or intervening elements or layers may be present.

Like reference numerals may refer to like elements throughout this specification. In the figures, the thickness of layers, films or regions may be exaggerated for clarity.

The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment may be referred to as a second element in another embodiment without departing from the scope of the appended claims. The singular forms, "a", "an" and "the" are intended to include the plural forms as well, unless the context clearly indicates otherwise.

Also, "under", "below", "above", "upper", and the like are used for explaining relational association of components or elements illustrated in the drawings. The terms are intended to be a relative concept and are described based on directions as illustrated in the drawings.

Hereinafter, exemplary embodiments of the present inventive concept will be described in detail with reference to the accompanying drawings. Same or substantially similar components will be designated with same reference numerals in the accompanying drawings.

Figure 2:
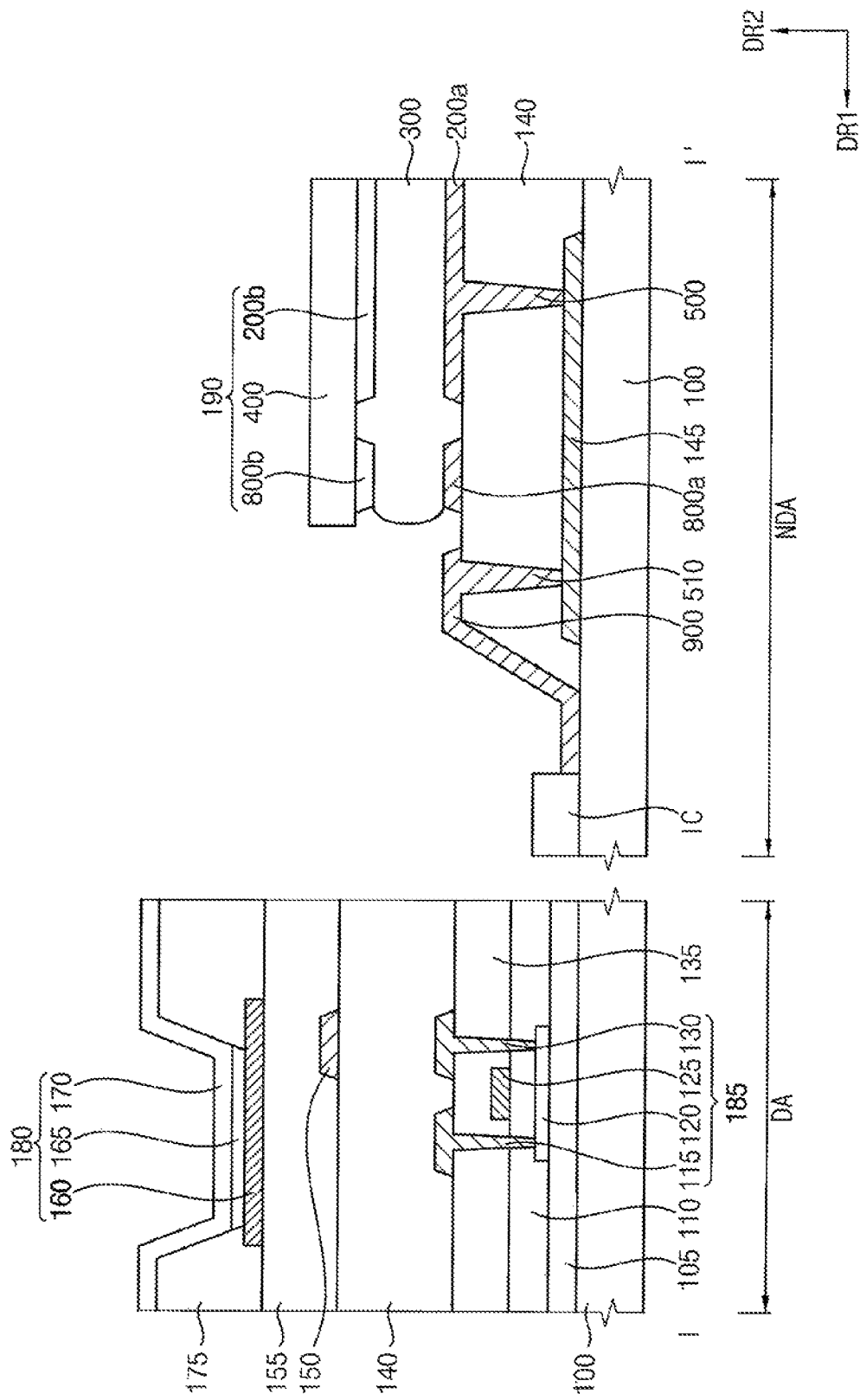
FIG. 2 is a cross-sectional view taken along line I-I' of FIG. 1 according to an exemplary embodiment of the inventive concept.

FIG. 1 is a plan view showing an organic light emitting display device according to some exemplary embodiments of the present invention, and FIG. 2 is a cross-sectional view taken along line I-I' of FIG. 1.

Referring to FIGS. 1 and 2, an organic light emitting display device 1000 may include a substrate 100, a buffer layer 105, a gate insulating layer 110, an interlayer insulating layer 135, a first via insulating layer 140, a wiring pattern 150, a second via insulating layer 155, a pixel defining layer 175, a connecting electrode 145, a pixel PX, a connecting structure 190, an integrated circuit IC, a wiring 910, a signal wiring 900, a lower pad 200a, a lower dummy pad 800a, an anisotropic conductive film 300, and the like.

Here, the connecting structure 190 may include an upper pad 200b, an upper dummy pad 800b, and a flexible substrate 400. The pixel PX may include an organic light emitting diode 180 and a semiconductor device 185. In addition, the semiconductor device 185 may include an active layer 120, a gate electrode 125, a source electrode 115, and a drain electrode 130. The organic light emitting diode 180 may include a lower electrode 160, an intermediate layer 165, and an upper electrode 170. Furthermore, the organic light emitting display device 1000 may include a display area DA and a non-display area NDA. In an embodiment of the inventive concept, the non-display area NDA may be positioned adjacent to the display area DA. For example, the non-display area NDA may at least partially surround the display area DA.

As shown in FIG. 1, a plurality of pixels PX may be disposed in the display area DA on the substrate. The pixels PX may be entirely arranged in the display area DA in a matrix form. For example, an image may be displayed in the display area DA through the organic light emitting diode 180 included in each of the pixels PX.

A plurality of the wirings 910 may be disposed in the non-display area NDA on the substrate 100. For example, the wirings 910 may be disposed between the display area DA and the integrated circuit IC. The wirings 910 may electrically connect the integrated circuit IC disposed in the non-display area NDA and the pixels PX disposed in the display area DA. The wirings 910 may include a data signal wiring, a gate signal wiring, a light emitting control signal wiring, a gate initialization signal wiring, an initialization voltage wiring, a power voltage wiring, and the like.

In addition, the integrated circuit IC connected to the signal wiring 900 and the wirings 910 may be disposed in the non-display area NDA on the substrate 100. The integrated circuit IC may receive signals (e.g., a data signal, a gate signal, a light emitting control signal, a gate initialization signal, an initialization voltage, a power voltage, etc.) generated from an external device through the signal wiring 900. Thereafter, the signals may be transmitted to the pixels PX of the display area DA through the wirings 910.

Furthermore, the connecting structure 190 may be disposed to be spaced apart from the integrated circuit IC in the non-display area NDA on the substrate 100. For example, the connecting structure 190 may be disposed in a lower side of the organic light emitting display device 1000. The connecting structure 190 and the integrated circuit IC are electrically connected by the signal wiring 900. In an embodiment of the inventive concept, the signals applied to the connecting structure 190 may be provided to the integrated circuit IC through the signal wiring 900.

However, FIG. 1 shows that the connecting structure 190 is disposed in the lower side of the organic light emitting display device 1000, but the configuration of the present inventive concept is not limited thereto. For example, the connecting structure 190 may be disposed in a left side, an upper side or a right side of the non-display area NDA of the organic light emitting display device 1000.

In addition, although a shape of each of the display area DA, the pixel PX, and the non-display area NDA of the organic light emitting display device 1000 has a rectangular planar shape, the shape is not limited thereto. For example, each of the display area DA, the pixel PX, and the non-display area NDA may have a triangular planar shape, a rhombus planar shape, a polygon planar shape, a circle planar shape, a track planar shape, or an elliptical planar shape.

As shown in FIG. 2, the substrate 100 may be provided. As the organic light emitting display device 1000 includes the display area DA and the non-display area NDA, the substrate 100 may also be divided into the display area DA and the non-display area NDA. The substrate 100 may be formed of various materials such as quartz, synthetic quartz, calcium fluoride, fluorine-doped quartz, soda-lime glass, alkali-free glass, poly ethylene terephthalate, poly ethylene naphthalate or polyimide.

The buffer layer 105 may be disposed in the display area DA on the substrate 100. The buffer layer 105 may prevent a diffusion of metal atoms or impurities from the substrate 100 into the pixel PX, and may control a rate of heat transfer during a crystallization process for forming the active layer 120 to obtain a substantially uniform active layer 120. In addition, when a surface of the substrate 100 is not uniform, the buffer layer 105 may increase a degree of uniformity of the surface of the substrate 100. Depending on a type of the substrate 100, two or more buffer layers 105 may be provided on the substrate 100, or the buffer layer 105 might not be disposed. For example, the buffer layer 105 may include an organic material or an inorganic material. In some exemplary embodiments, the buffer layer 105 may have a single layer or a multilayer structure formed of the inorganic insulator such as a silicon oxide ($SiO_x$), a silicon nitride ($SiN_x$), or a silicon oxynitride ($SiO_xN_y$), and the like. In some exemplary embodiments, the buffer layer 105 may be disposed in the non-display area NDA as well as the display area DA.

The active layer 120 may be disposed in the display area DA on the buffer layer 105. According to an embodiment of the inventive concept, the active layer 120 may be disposed between the buffer layer 105 and the gate insulating layer 110. The active layer 120 may include a metal oxide semiconductor, an inorganic semiconductor (e.g., amorphous silicon, polysilicon), or an organic semiconductor.

The gate insulating layer 110 may be disposed in the display area DA on the buffer layer 105. The gate insulating layer 110 may at least partially cover the active layer 120 disposed on the buffer layer 105 and have a flat upper surface without forming a step around the gate insulating layer 110. Alternatively, the gate insulating layer 110 may be disposed to have a substantially same thickness along a profile of the active layer 120 on the buffer layer 105. The gate insulating layer 110 may include a silicon compound, a metal oxide, and the like. For example, the gate insulating layer 110 may include a silicon oxide ($SiO_x$), a silicon nitride ($SiN_x$), a silicon oxynitride ($SiO_xN_y$), a silicon oxycarbide (SiOC), a silicon carbonitride (SiCN), an aluminum oxide ($Al_2O_3$), an aluminum nitride (AlN), a tantalum oxide ($Ta_2O_5$), a hafnium oxide ($HfO_2$), a zirconium oxide ($ZrO_2$), a titanium oxide ($TiO_2$), and the like. In some exemplary embodiments, the gate insulating layer 110 may have a multilayer structure including a plurality of insulating layers. The insulating layers may have different materials and different thicknesses. In addition, the gate insulating layer 110 may be disposed in the non-display area NDA as well as the display area DA.

The gate electrode 125 may be disposed in the display area DA on the gate insulating layer 110. According to an exemplary embodiment of the inventive concept, the gate electrode 125 may be disposed on a portion of the gate insulating layer 110 under which the active layer 120 is disposed. The gate electrode 125 may include a metal, an alloy, a metal nitride, a conductive metal oxide, a transparent conductive material, and the like. For example, the gate electrode 125 may be formed in a single layer or multilayer of one or more materials of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and an alloy thereof, or a combination thereof.

The interlayer insulating layer 135 may be disposed on the gate insulating layer 110. The interlayer insulating layer 135 may at least partially cover the gate electrode 125 disposed on the gate insulating layer 110 and have a flat upper surface without forming a step around the interlayer insulating layer 135. Alternatively, the interlayer insulating layer 135 may be disposed on the gate insulating layer 110 to have a substantially same thickness along a profile of the gate electrode 125. The interlayer insulating layer 135 may include a silicon compound, a metal oxide, and the like. In some exemplary embodiments, the interlayer insulating layer 135 may have the multilayer structure including the plurality of the insulating layers. The insulating layers may have different materials and different thicknesses. In addition, the interlayer insulating layer 135 may be disposed in the non-display area NDA as well as the display area DA.

The source electrode 115 and the drain electrode 130 may be disposed in the display area DA on the interlayer insulating layer 135. The source electrode 115 may be connected to the source area of the active layer 120 through the first contact hole formed by removing a first portion of the interlayer insulating layer 135 and the gate insulating layer 110. The drain electrode 130 may be connected to the drain area of the active layer 120 through the second contact hole formed by removing a second portion of the interlayer insulating layer 135 and the gate insulating layer 110. Each of the source electrode 115 and the drain electrode 130 may include a metal, an alloy, a metal nitride, a conductive metal oxide, a transparent conductive material, a combination thereof, and the like.

Accordingly, the semiconductor device 185 including the active layer 120, the gate electrode 125, the source electrode 115, and the drain electrode 130 may be disposed.

The connecting electrode 145 may be disposed in the non-display area NDA on the substrate 100. The connecting electrode 145 may be electrically connected to the lower pad 200*a* through a first contact hole 500 of the first via insulating layer 140 which is disposed in the display area DA on the substrate 100. The connecting electrode 145 may be electrically connected to the signal wiring 900 through the second contact hole 510 of the first via insulating layer 140. The connecting electrode 145 might not be in contact with the lower dummy pad 800a and the integrated circuit IC by the first via insulating layer 140. The connecting electrode 145 may include a metal, an alloy, a metal nitride, a conductive metal oxide, a transparent conductive material, a combination thereof, and the like.

The first via insulating layer 140 may be disposed on the interlayer insulating layer 135 in the display area DA, and the first via insulating layer 140 may cover the source electrode 115 and the drain electrode 130. In addition, the first via insulating layer 140 may be disposed in a portion of the non-display area NDA on the substrate 100, and may cover the connecting electrode 145. In some exemplary embodiments, the first via insulating layer 140 may include the first contact hole 500 and the second contact hole 510. The first contact hole 500 may overlap the lower pad 200a and expose a first portion of the connecting electrode 145. The second contact hole 510 may overlap the signal wiring 900 and expose a second portion of the connecting electrode 145. In addition, the first contact hole 500 and the second contact hole 510 might not overlap the lower dummy pad 800a. The first via insulation layer 140 may be in contact with the anisotropic conductive film 300 through an area or a space in which the lower pad 200a and the lower dummy pad 800a are spaced apart from each other. Furthermore, in the non-display area NDA on the substrate 100, the first via insulation layer 140 may be spaced apart from the integrated circuit IC, and might not overlap the integrated circuit IC.

The first via insulating layer 140 may be disposed to have a relatively large thickness to sufficiently cover the source electrode 115, the drain electrode 130, and the connection electrode 145. In this case, a planarization process may be added to the first via insulating layer 140 to achieve a flat upper surface of the first via insulating layer 140. Alternatively, the first via insulation layer 140 may cover the source electrode 115, the drain electrode 130, and the connecting electrode 145 (in the non-display area NDA), and may be disposed along the profile of the source electrode 115, the drain electrode 130, and the connecting electrode 145 with a uniform thickness. The first via insulating layer 140 may be formed of an organic material or an inorganic material. In some exemplary embodiments of the inventive concept, the first via insulating layer 140 may be formed of an organic material such as an acrylic, a benzo-cyclobutene ("BCB"), a polyimide, or a hexa-methyl-di-siloxane ("HMDSO"), and the like.

The wiring pattern 150 may be disposed in the display area DA on the first via insulating layer 140. Alternatively, the wiring pattern 150 may be connected to the drain electrode 130 or the lower electrode 160 in a cross-sectional view of the organic light emitting display device 1000. The wiring pattern 150 may include a metal, an alloy, a metal nitride, a conductive metal oxide, a transparent conductive material, a combination thereof, and the like.

The lower pad 200a may be disposed in the non-display area NDA on the first via insulating layer 140. The lower pad 200a may be connected to the first portion of the connecting electrode 145 through the first contact hole 500. The lower pad 200a may receive the signal from the upper pad 200b and transmit the signal to the connecting electrode 145 through the first contact hole 500. The lower pad 200a may be in contact with the anisotropic conductive film 300. The lower pad 200a may extend in a direction from the non-display area NDA to the display area DA, and may be electrically connected to the pixel PX. According to an embodiment of the inventive concept, the lower pad 200a may be electrically connected to the wirings 910 disposed in the display area DA. The lower pad 200a may include first to n-th lower pads, where n is an integer of 1 or more. The first to n-th lower pads may be spaced apart from each other and arranged in parallel to the non-display area NDA. The lower pad 200a may include a metal, an alloy, a metal nitride, a conductive metal oxide, a transparent conductive material, a combination thereof, and the like.

The lower dummy pad 800a may be spaced apart from the lower pad 200a in a first direction DR1 in the non-display area NDA on the first via insulating layer 140. The lower dummy pad 800a may be disposed to at least partially overlap the anisotropic conductive film 300. Since the lower dummy pad 800a is spaced apart from the lower pad 200a, the signal might not be applied or transmitted between the two elements. The lower dummy pad 800a and the lower pad 200a may be disposed on a same layer. The lower dummy pad 800a may be disposed to at least partially overlap the upper dummy pad 800b. The lower dummy pad 800a might not be in contact with the connecting electrode 145. The lower dummy pad 800a may include first to n-th lower pads. The first to n-th lower dummy pads may be spaced apart from each other and arranged in parallel to the non-display area NDA. For example, each of the first to n-th lower dummy pads may be spaced apart from each of the first to n-th lower dummy pads in a first direction DR1. The lower dummy pad 800a may include a metal, an alloy, a metal nitride, a conductive metal oxide, a transparent conductive material, a combination thereof, and the like.

The signal wiring 900 may be spaced apart from the lower dummy pad 800a in the first direction DR1 in the non-display area NDA on the first via insulating layer 140. The signal wiring 900 may be connected to the second portion of the connecting electrode 145 through the second contact hole 510. According to an embodiment of the inventive concept, the signal wiring 900 may be electrically connected to the connecting electrode 145 through the second contact hole 510. Since the signal wiring 900 is spaced apart from the lower dummy pad 800a, the signal wiring 900 might not be electrically connected to the lower dummy pad 800a. A first end of the signal wiring 900 may overlap the first via insulating layer 140, and a second end opposite to the first end of the signal wiring 900 may be connected to the integrated circuit IC. The signal wiring 900 might not be in contact with the anisotropic conductive film 300. For example, when the signal wiring 900 is in contact with the anisotropic conductive film 300, the signal wiring 900 may be shorted. The signal wiring 900 may include first to n-th signal wirings. The first to n-th signal wirings may be spaced apart from each other and arranged in parallel to the non-display area NDA. Each of the first to n-th signal wirings may be spaced apart from each of the first to n-th lower dummy pads in the first direction DR1. Alternatively, the anisotropic conductive film 300 may be disposed in at least a portion of the space where each of the first to n-th signal wirings is spaced apart from each of the first to n-th lower dummy pads. According to an embodiment of the inventive concept, even in this case, the anisotropic conductive film 300 might not be in contact with the first to n-th signal wirings. The signal wiring 900 may include a metal, an alloy, a metal nitride, a conductive metal oxide, a transparent conductive material, a combination thereof, and the like.

The second via insulating layer 155 may be disposed in the display area DA on the first via insulating layer 140. The second via insulating layer 155 may cover the wiring pattern 150 on the first via insulating layer 140 and have a flat upper surface without forming a step around the second via insulating layer 155. Alternatively, the second via insulating layer 155 may be disposed on the first via insulating layer 140 to have a substantially same thickness along a profile of the wiring pattern 150. In some exemplary embodiments of the inventive concept, the second via insulating layer 155 may include an organic material.

The lower electrode 160 may be disposed on the second via insulating layer 155, and the lower electrode 160 may include a transparent electrode, a reflective electrode, or a transflective electrode.

The pixel defining layer 175 may be disposed in the display area DA on the substrate. The pixel defining layer 175 may be disposed on the second via insulating layer 155 to expose a portion of the upper surface of the lower electrode 160. The pixel defining layer 175 may include an organic material.

The intermediate layer 165 may be disposed on the lower electrode 160 where a portion of the upper surface is exposed by the pixel defining layer 175. The intermediate layer 165 may have a structure in which a hole injection layer, a hole transport layer, a light emitting layer, an electron transport layer, an electron injection layer, and the like are either singular or disposed in plural.

The upper electrode 170 may be disposed on the pixel defining layer 175 and the intermediate layer 165. The upper electrode 170 may include a translucent electrode or a reflective electrode.

Accordingly, the organic light emitting diode 180 including the lower electrode 160, the intermediate layer 165, and the upper electrode 170 may be disposed.

The upper pad 200b may be disposed to at least partially overlap the lower pad 200a. The upper pad 200b may be disposed to at least partially overlap the anisotropic conductive film 300. The upper pad 200b may transmit the signal provided from outside to the lower pad 200a through the anisotropic conductive film 300. The upper pad 200b may include first to n-th upper pads. The first to n-th upper pads may be spaced apart from each other and arranged in parallel to the non-display area NDA. The upper pad 200b may include a metal, an alloy, a metal nitride, a conductive metal oxide, the transparent conductive material, a combination thereof, and the like.

The upper dummy pad 800b may be disposed to overlap the lower dummy pad 800a. The upper dummy pad 800b may be spaced apart from the upper pad 200b in the first direction DR1. Since the upper dummy pad 800b and the upper pad 200b are spaced apart from each other, the upper dummy pad 800b and the upper pad 200b might not be electrically connected to each other. The upper dummy pad 800b and the upper pad 200b may be disposed on a same layer. The upper dummy pad 800b may include first to n-th upper dummy pads. The first to n-th upper dummy pads may be spaced apart from each other and arranged in parallel to the non-display area NDA. According to an embodiment of the inventive concept, each of the first to n-th upper dummy pads may be spaced apart from each of the first to n-th upper pads in the first direction DR1. The anisotropic conductive film 300 may fill a space or an area in which each of the first to n-th upper dummy pads is spaced apart from each of the first to n-th upper pads. The upper dummy pad 800b may include a metal, an alloy, a metal nitride, a conductive metal oxide, a transparent conductive material, a combination thereof, and the like.

The flexible substrate 400 may be disposed on the upper dummy pad 800b and the upper pad 200b. For example, the upper pad 200b may be disposed between the flexible substrate 400 and the lower pad 200a. The flexible substrate 400 and the anisotropic conductive film 300 may be in contact with each other through an space or area (e.g., empty) in which the upper pad 200b and the upper dummy pad 800b are spaced apart from each other. The flexible substrate 400 may be formed of various materials the same as the substrate 100.

The anisotropic conductive film 300 may be disposed between the upper pad 200b and the lower pad 200a. The anisotropic conductive film 300 is a conductive film in which fine conductive particles are mixed with a generally thermosetting adhesive resin to form a film state, and electrically connected only in one direction. In some embodiments, the flow of electricity may occur exclusively in one direction through the anisotropic conductive film 300. The signal may be transmitted from the upper pad 200b to the lower pad 200a through the anisotropic conductive film 300. The anisotropic conductive film 300 may also be disposed between the upper dummy pad 800b and the lower dummy pad 800a. Since the upper dummy pad 800b is spaced apart from the upper pad 200b, the signal might not transmit from the upper dummy pad 800b to the anisotropic conductive film 300. When heat and pressure are applied to the anisotropic conductive film 300, an end portion of the anisotropic conductive film 300 in the first direction DR1 may overflow in the first direction DR1. As described above, when heat and pressure are applied to the anisotropic conductive film 300, the anisotropic conductive film 300 may fill a space or area where the upper pad 200b and the upper dummy pad 800b are spaced apart from each other and the lower pad 200a and the lower dummy pad 800a are spaced apart from each other. The anisotropic conductive film 300 may be formed of fine conductive particles. The fine conductive particles include nickel (Ni) grains, carbon (C) grains, lead (Pb) grains, and the like, but are not limited thereto.

Accordingly, the connecting structure 190 including the upper dummy pad 800b, the upper pad 200b, and the flexible substrate 400 may be disposed.

According to some exemplary embodiments of the inventive concept, the organic light emitting display device 1000 may include pads having an upper dummy pad 800b and a lower dummy pad 800a. Accordingly, the pads might not be shorted even when residue 20 adheres to an end portion of the anisotropic conductive film 300. Thus, driving efficiency of the organic light emitting display device 1000 may be increased.

Figure 3:
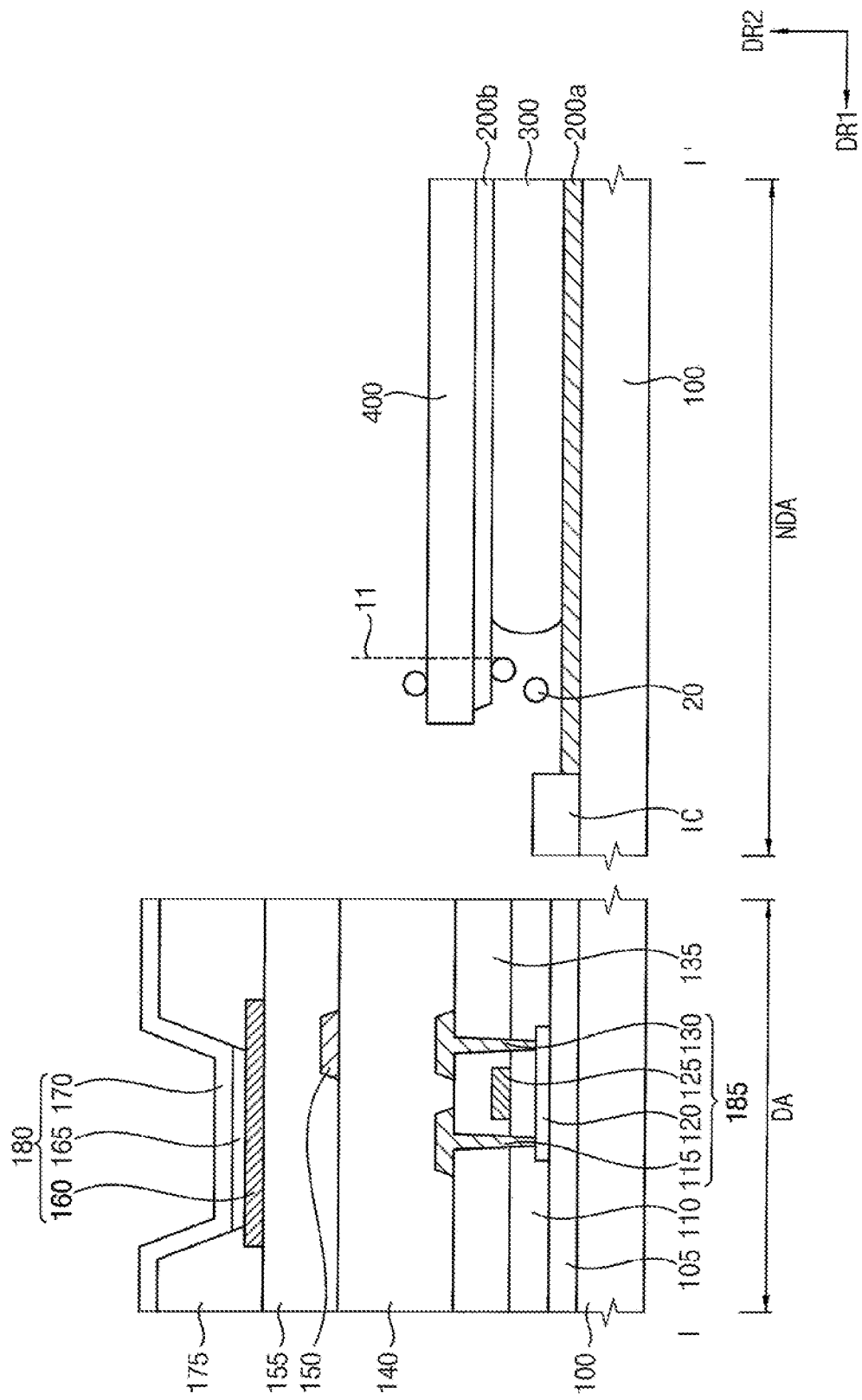
FIGS. 3 and 4 are cross-sectional views taken along line I-I' of FIG. 1 illustrating a method of manufacturing an organic light emitting display device according to some exemplary embodiments of the inventive concept.
Figure 4:
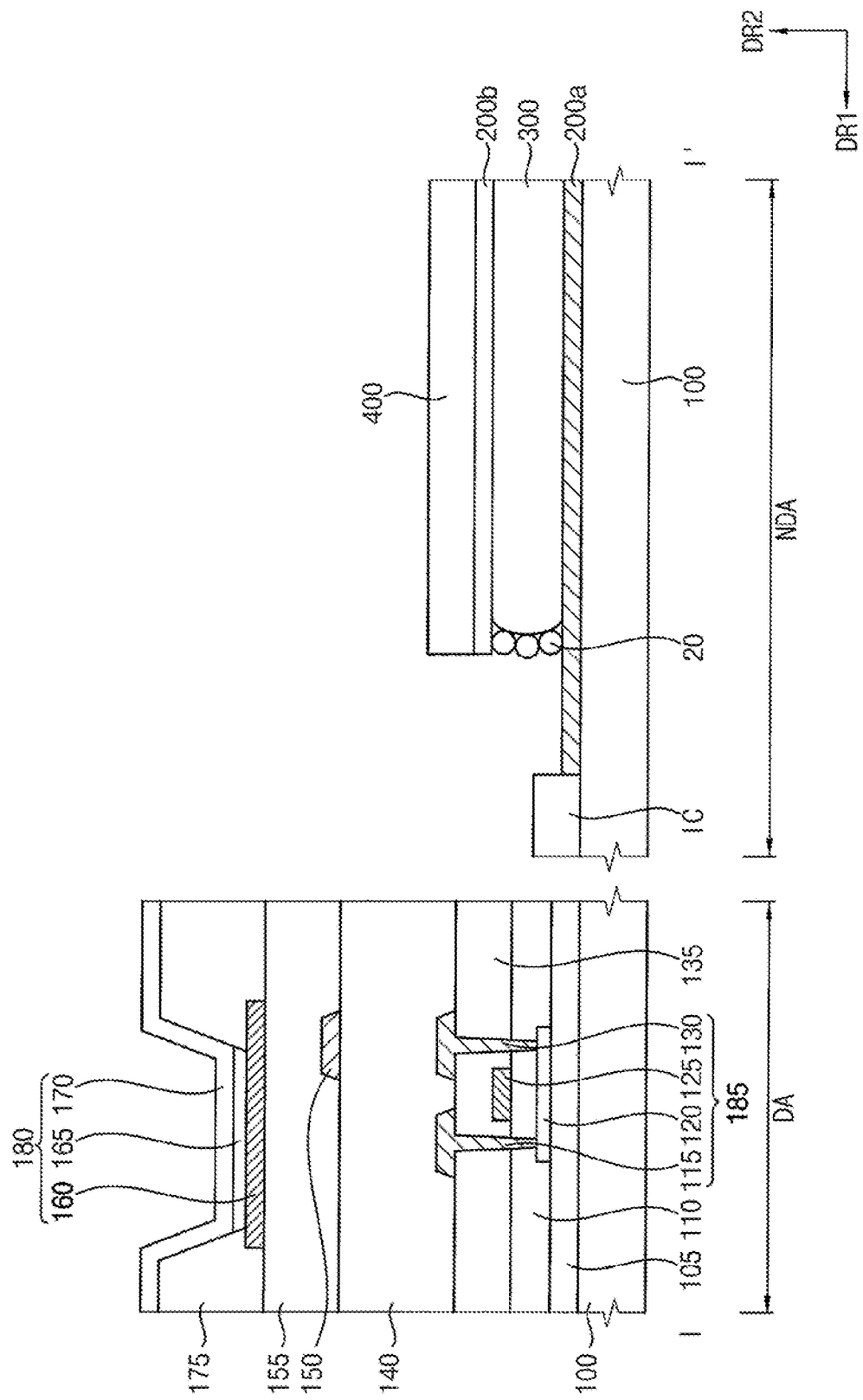
Figure 5:
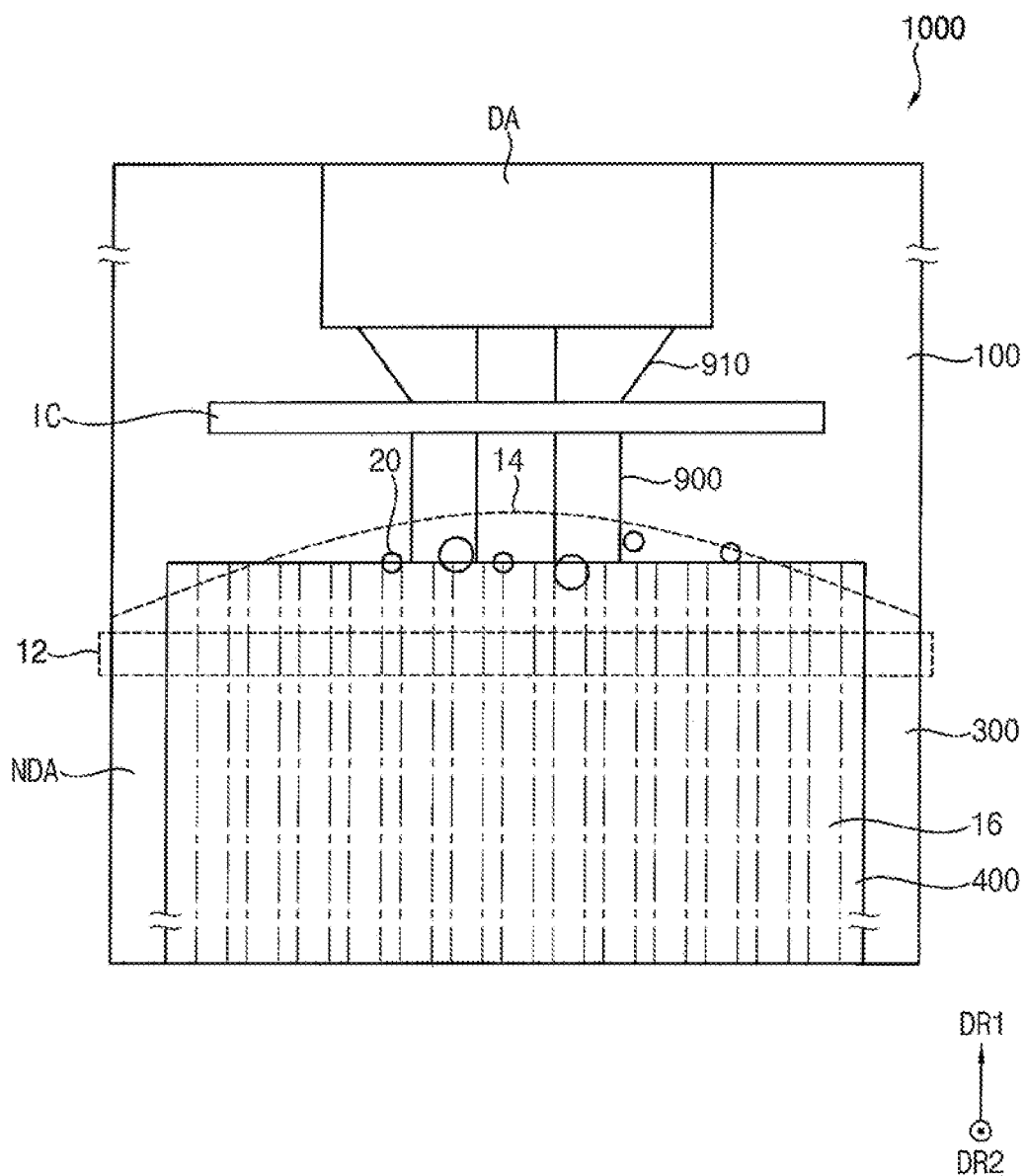
FIG. 5 is a plan view illustrating a method of manufacturing an organic light emitting display device according to an exemplary embodiment of the inventive concept.

FIGS. 3, 4 and 5 are views showing a method of manufacturing an organic light emitting display device.

Referring to FIG. 3, the anisotropic conductive film 300 may be disposed on the substrate 100 on which the lower pad 200a is disposed. The upper pad 200b that are not cut and the flexible substrate 400 may be disposed on the anisotropic conductive film 300. In the organic light emitting display device 1000, the signal may transmit along the upper pad 200b in the first direction DR1. The signal transmitting along the upper pad 200b may transmit in a reverse direction of a second direction DR2 through the anisotropic conductive film 300 and be transmitted to the lower pad 200a. The signal reaching the lower pad 200a may flow from the lower pad 200a in the first direction DR1 to the integrated circuit IC and the display area DA. The display area DA may display an image in response to the signal. However, in order to increase a process margin and efficiently transmit the signal, the upper pad 200b and the flexible substrate 400 disposed on the anisotropic conductive film 300 may be cut along a dotted line 11. The residue 20 may occur in the cutting operation. Some traditional processing techniques might not completely remove the residue 20.

FIG. 4 is a cross-sectional view showing a state in which the residue 20 adheres to the end portion of the anisotropic conductive film 300 in the first direction DR1.

Referring to FIG. 4, the residue 20 may adhere to the end portion of the anisotropic conductive film 300 in the first direction DR1. The residue 20 may include a metal material. Therefore, the signal transmitting through the upper pad 200b may transmit through the residue 20 including the metal material without transmitting through the anisotropic conductive film 300 to the lower pad 200a. When the signal transmits through the residue 20, a short circuit may occur due to the low resistance of the metal material included in the residue 20. When the short circuit occurs, an excessive signal transmits through the residue 20, and the driving efficiency of the organic light emitting display device 1000 may decrease.

FIG. 5 is a plan view showing a state in which the residue 20 adheres to the end portion of the anisotropic conductive film 300 in the first direction DR1.

Referring to FIG. 5, the signal may transmit through the signal wiring 900 connecting the non-display area NDA and the integrated circuit IC, and the wiring 910 connecting the integrated circuit IC and the display area DA. In order for the signal to transmit, the signal may need to transmit from the non-display area NDA. When the residue 20 adheres to an end portion 14 of the anisotropic conductive film 300 along the first direction DR1, the signal might not transmit smoothly due to the short circuit.

The flexible substrate 400 may be disposed on the non-display area NDA of the substrate 100. A dotted line 16 portion indicated on the flexible substrate 400 may represent the pads. The pads disposed in the dotted line 16 portion may be formed extending in the first direction DR1 and may overlap each other in the second direction DR2. In addition, the pads disposed in the dotted line 16 portion may be spaced apart in parallel in a direction perpendicular to the first direction DR1. The dotted line 14 portion displayed at an end portion of the flexible substrate 400 along the first direction DR1 may represent the end portion of the first direction DR1 of the anisotropic conductive film 300. The residue 20 adhered to the anisotropic conductive film 300 positioned in the dotted line 14 portion may cause the short circuit between the pads overlapped in the second direction DR2. In addition, the short circuit may occur between the pads spaced apart in parallel in the direction perpendicular to the first direction DR1 due to the residue 20. Accordingly, the driving efficiency of the organic light emitting display device 1000 may be increased by patterning the dotted line 12 portion to prevent the signal from transmitting to the end portion of the pad in the first direction DR1 in order to prevent the short circuit.

Therefore, as described above, according to some exemplary embodiments of the inventive concept, a technical feature may be patterned to form the upper dummy pad 800b spaced apart from the upper pad 200b. The lower pad 200a may be patterned to form the lower dummy pad 800a spaced apart from the lower pad 200a. The lower dummy pad 800a may be patterned to form the signal wiring 900 spaced apart from the lower dummy pad 800a. The signal wiring 900 may be spaced apart from the anisotropic conductive film 300. In this process, the end portion of the anisotropic conductive film 300 along the first direction DR1 to which the residue 20 adheres may be in contact with the upper dummy pad 800b and the lower dummy pad 800a and no other parts. Accordingly, the signal might not transmit through the residue 20, thereby preventing the short circuit occurring through the residue 20.

Figure 6:
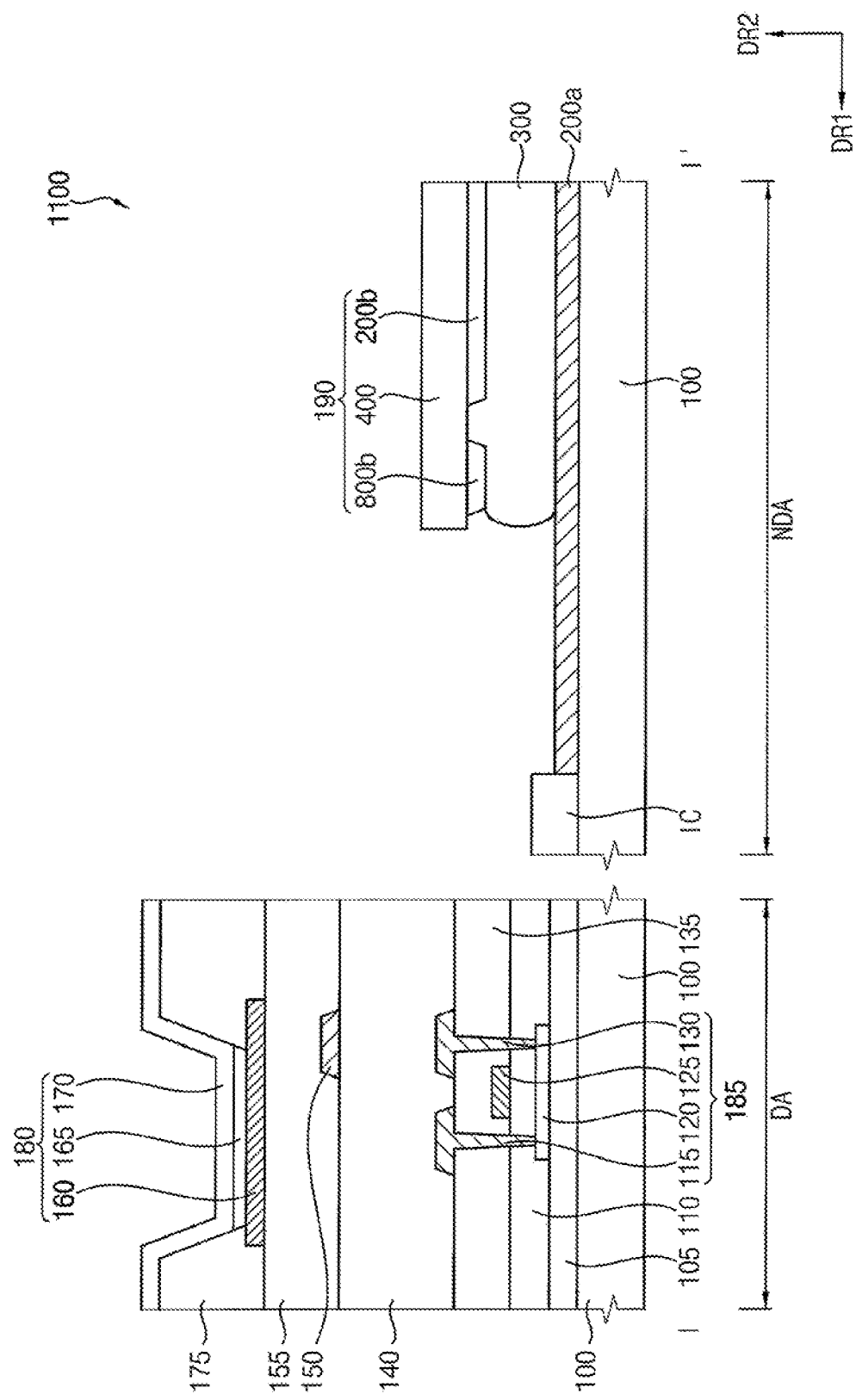
FIG. 6 is a cross-sectional view illustrating an organic light emitting display device according to an exemplary embodiment of the inventive concept.

FIG. 6 is a cross-sectional view showing an organic light emitting display device according to some exemplary embodiments of the inventive concept. The organic light emitting display device 1100 of FIG. 6 may be same as or substantially similar to the organic light emitting display device of FIG. 2 except for the presence of the lower dummy pad 800a, the signal wiring 900, the first and second contact hole 500 and 510, the first via insulating layer, and the connecting electrode 145 in the non-display area NDA. Accordingly, to the extent that a description of an element has been omitted, it may be assumed that the description is at least similar to that of corresponding elements that have been described elsewhere in the instant specification. For example, FIG. 6 may correspond to a cross-sectional view taken along the line I-I' of FIG. 1.

Referring to FIG. 6, the organic light emitting display device 1100 may include the substrate 100, the buffer layer 105, the gate insulating layer 110, the interlayer insulating layer 135, the wiring pattern 150, the second via insulating layer 155, pixel defining layer 175, the pixel PX, the connecting structure 190, the integrated circuit IC, the lower pad 200a, the anisotropic conductive film 300, and the like.

The lower pad 200a may be disposed on the substrate 100. In some exemplary embodiments of the inventive concept, the bottom surface of the lower pad 200a may be in direct contact with the substrate 100. The anisotropic conductive film 300 may be disposed on one side of the lower pad 200a. The lower pad 200a may extend in the first direction DR1 on the substrate 100 to be in contact with the integrated circuit IC. The lower pad 200a may transmit the signal received through the connecting structure 190 to the display area DA through the integrated circuit IC.

The organic light emitting display device 1000 according to some exemplary embodiments may include the pads having an upper dummy pad 800b and a lower dummy pad 800a. Accordingly, the pads might not be shorted even when the residue 20 adheres to the end portion of the anisotropic conductive film 300. Thus, the driving efficiency of the organic light emitting display device 1000 may be increased.

In addition, the organic light emitting display 1100 might not include the first via insulating layer 140 in which the first and second contact holes 500 and 510, and the connecting electrode 145, and the like are formed in the non-display area NDA. The organic light emitting display device 1100 might not include the second via insulating layer 155 and the wiring pattern 150 in the display area DA. Therefore, the organic light emitting display device 1100 may have a smaller size than a size of the organic light emitting display device 1000 of FIG. 2.

Embodiments of the present invention may be applied to various electronic devices including an organic light emitting display device. For example, embodiments of the present inventive concept may be applied to a vehicle-based display device, a ship-based display device, an aircraft-based display device, a portable communication device, a display device for display or information communication, a medical-display device, etc.

While the inventive concept has been particularly shown and described with reference to the exemplary embodiments thereof, it will be understood by one of ordinary skill in the art that variations in form and detail may be made therein without departing from the spirit and scope of the inventive concept.

What is claimed is:

1. An organic light emitting display device, comprising:
   a substrate having a display area and a non-display area at least partially surrounds the display area;

a pixel structure disposed in the display area on the substrate;

a via insulating layer disposed in the non-display area on the substrate and having a contact hole;

a lower pad disposed on the via insulating layer; and a connecting structure including:

a flexible substrate disposed on the lower pad;

an upper pad disposed between the flexible substrate and the lower pad; and an upper dummy pad spaced apart from the upper pad in a first direction on a bottom surface of the flexible substrate, wherein the first direction is a direction in which the lower pad is spaced apart from the pixel structure.

2. The organic light emitting display device of claim 1, wherein the upper pad at least partially overlaps the lower pad.

3. The organic light emitting display device of claim 1, further comprising a signal wiring spaced apart from the lower pad in the first direction on the via insulating layer.

4. The organic light emitting display device of claim 3, further comprising a connecting electrode disposed between the via insulating layer and the substrate.

5. The organic light emitting display device of claim 4, wherein the contact hole of the via insulating layer includes:

a first contact hole at least partially overlapping the lower pad; and a second contact hole at least partially overlapping the signal wiring.

6. The organic light emitting display device of claim 5, wherein the lower pad is connected to a first portion of the connecting electrode through the first contact hole, and the signal wiring is connected to a second portion of the connecting electrode different from the first portion of the connecting electrode through the second contact hole.

7. The organic light emitting display device of claim 3, further comprising a lower dummy pad disposed on the via insulating layer between the signal wiring and the lower pad.

8. The organic light emitting display device of claim 7, wherein the lower dummy pad, the signal wiring, and the lower pad are located on a same layer.

9. The organic light emitting display device of claim 7, wherein the upper dummy pad at least partially overlaps the lower dummy pad.

10. The organic light emitting display device of claim 7, further comprising an anisotropic conductive film disposed between the upper pad and the lower pad.

11. The organic light emitting display device of claim 10, wherein the anisotropic conductive film is spaced apart from the signal wiring.

12. The organic light emitting display device of claim 10, wherein the anisotropic conductive film is in contact with the upper dummy pad or the lower dummy pad.

13. The organic light emitting display device of claim 10, wherein the anisotropic conductive film fills a space where the upper pad is spaced apart from the upper dummy pad and a space where the lower pad is spaced apart from the lower dummy pad.

14. The organic light emitting display device of claim 3, further comprising an integrated circuit disposed in the non-display area on the substrate.

15. The organic light emitting display device of claim 14, wherein the via insulating layer does not overlap the integrated circuit.

16. The organic light emitting display device of claim 14, wherein a first end portion of the signal wiring at least partially overlaps the via insulating layer, and a second end portion, which is opposite to the first end portion, of the signal wiring is connected to the integrated circuit.

17. The organic light emitting display device of claim 1, wherein the pixel structure includes:

a lower electrode disposed in the display area on the substrate;

an intermediate layer disposed on the lower electrode; and an upper electrode disposed on the intermediate layer.

18. The organic light emitting display device of claim 1, further comprising a semiconductor element disposed between the pixel structure and the substrate, wherein the semiconductor element includes:

an active layer disposed on the substrate;

a gate electrode disposed on the active layer; and a source electrode and a drain electrode disposed on the gate electrode.

19. The organic light emitting display device of claim 18, further comprising a wiring pattern disposed on the source electrode and the drain electrode, wherein the wiring pattern and the lower pad are located on a same layer.

20. The organic light emitting display device of claim 19, further comprising another via insulating layer disposed in the display area on the substrate, wherein the another via insulating layer covers the wiring pattern.

21. An organic light emitting display device, comprising:

a substrate having a display area and a non-display area at least partially surrounds the display area;

a pixel structure disposed in the display area on the substrate;

a via insulating layer disposed in the non-display area on the substrate and having a contact hole;

a lower pad disposed on the via insulating layer; and a connecting structure including:

a flexible substrate disposed on the lower pad;

an upper pad disposed between the flexible substrate and the lower pad; and an upper dummy pad spaced apart from the upper pad in a first direction on a bottom surface of the flexible substrate, wherein the upper dummy pad is disposed between the pixel structure and the upper pad in the first direction.

* * * * *